United States Patent [19]

Young

[11] Patent Number: 5,247,479
[45] Date of Patent: Sep. 21, 1993

[54] CURRENT SENSING AMPLIFIER FOR SRAM

[75] Inventor: Ian Young, Portland, Oreg.

[73] Assignee: Intel Corporation, Santa Clara, Calif.

[21] Appl. No.: 704,794

[22] Filed: May 23, 1991

[51] Int. Cl.$^5$ ............... G11C 7/00; G11C 7/02; G01R 19/00

[52] U.S. Cl. .............. 365/189.05; 365/205; 365/206; 365/190; 307/530

[58] Field of Search ............ 365/189.05, 205, 208, 365/190; 307/530; 330/253, 288

[56] References Cited

U.S. PATENT DOCUMENTS

| | | | |
|---|---|---|---|
| 4,658,160 | 8/1987 | Young | 307/530 |
| 4,677,592 | 6/1987 | Sakurai et al. | 365/222 |
| 4,796,230 | 1/1989 | Young | 307/530 |
| 4,888,503 | 12/1989 | Young | 307/530 |
| 5,023,841 | 6/1991 | Akrout et al. | 365/205 |

Primary Examiner—Rolf Hille
Assistant Examiner—Wael Fahmy
Attorney, Agent, or Firm—Blakely, Sokoloff, Taylor & Zafman

[57] ABSTRACT

A sense amplifier for use in conjunction with a static random access memory array (SRAM) which uses a local or column sense amplifier. The column sense amplifier is a transconductance source coupled differential pair which converts a voltage differential on bitlines from a selected memory cell in a column of memory cells whose content is being read to a current differential. A global or secondary sense amplifier inputs the current differential on sense lines from each local or column sense amplifier, converts the current differential to a voltage differential and then amplifies the voltage differential. A current differential greater than that which can be produced using prior art techniques appears on the sense lines which in turn allows the content of a memory cell being read to be determined more quickly.

9 Claims, 5 Drawing Sheets

CURRENT SENSING AMPLIFIER FOR SRAM

BACKGROUND OF THE INVENTION

1. Field of the Invention

This invention relates to the field of sense amplifiers used to sense differential voltages on bitlines for reading 0s and 1s in cells of SRAM arrays and amplifying the differential voltages for use by an output buffer to drive a capacitive load.

2. Prior Art

U.S. Pat. No. 4,658,160 teaches a common gate differential sense amplifier which does not require additional level shifting circuits, is not sensitive to process variations and is resistant to hot electron effects. The invention of this patent teaches the use of current mirror pairs of transistors as active loads and a balanced pair of differential amplifiers having a common gate. The differential amplifiers provide DC level shifting without the need for additional circuitry while the active current mirrors provide differential to single ended conversion of the input-output signal which is then passed through one of more gain stages to drive an output buffer. U.S. Pat. No. 4,888,503 is an improvement over the invention described in U.S. Pat. No. 4,658,160 which is less sensitive to input voltage and current variations and is substantially independent of voltage changes on the data lines. U.S Pat. No. 4,796,230 is directed to a decoder circuit which provides for fastest sensing of the signal current from a SRAM cell. The decoder circuit of this invention transfers the signal from the bit line pairs to the output line pairs while isolating the bit line capacitance from the output line capacitance to reduce the total capacitance which must be driven for transfer of information from the SRAM to the sense amplifier. The isolation of the bit line capacitance from the output line capacitance results in a decrease in the time required for transferring data from the SRAM to the sense amplifier.

SUMMARY OF THE INVENTION

A sense amplifier is disclosed for use in conjunction with a static random access memory array (SRAM). The invented sense amplifier uses a local or column sense amplifier which is a transconductance source coupled differential pair which converts a voltage differential on bitlines from a selected memory cell in a column of memory cells whose content is being read to a current differential. The invention also utilizes a global or secondary sense amplifier which inputs the current differential on sense lines from each local or column sense amplifier, converts the current differential to a voltage differential and then amplifies the voltage differential.

By using the present invention, a current differential greater than that which can be produced using prior art techniques appears on the sense lines which in turn allows the content of a memory cell being read to be determined more quickly.

DETAILED DESCRIPTION OF THE INVENTION

A sense amplifier is disclosed for use in conjunction with a static random access memory array (SRAM). The invented sense amplifier uses a local or column sense amplifier which is a transconductance source coupled differential pair which converts a voltage differential on bitlines from a selected memory cell in a column of memory cells whose content is being read to a current differential, there being one column sense amplifier for each column in the SRAM array. This transconductance column sense amplifier is used instead of a common gate differential sense amplifier known in the prior art such as U.S. Pat. Nos. 4,658,160 and 4,888,503 by the present inventor and also assigned to Intel Corporation. The invention also utilizes a global or secondary sense amplifier which inputs the current differential on sense lines from each local or column sense amplifier, converts the current differential to a voltage differential and then amplifies the voltage differential.

By using the present invention, a current differential greater than that which can be produced using prior art techniques appears on the sense lines which in turn allows the content of a memory cell being read to be determined more quickly. In this manner, faster memory speeds are possible than would be the case using prior art techniques. By virtue of the faster memory access times made possible, the present invention also has application in BiCMOS circuit designs. In this connection, while BiCMOS circuits perform better than CMOS circuits at a 5 volt supply, BiCMOS circuits generally do not perform as well as CMOS at a 3.3 volt supply used in TTL SRAM. However, by using the present invention, a BiCMOS TTL SRAM will maintain its performance advantage over a CMOS TTL SRAM with a 3.3 volt supply.

Figure 1:
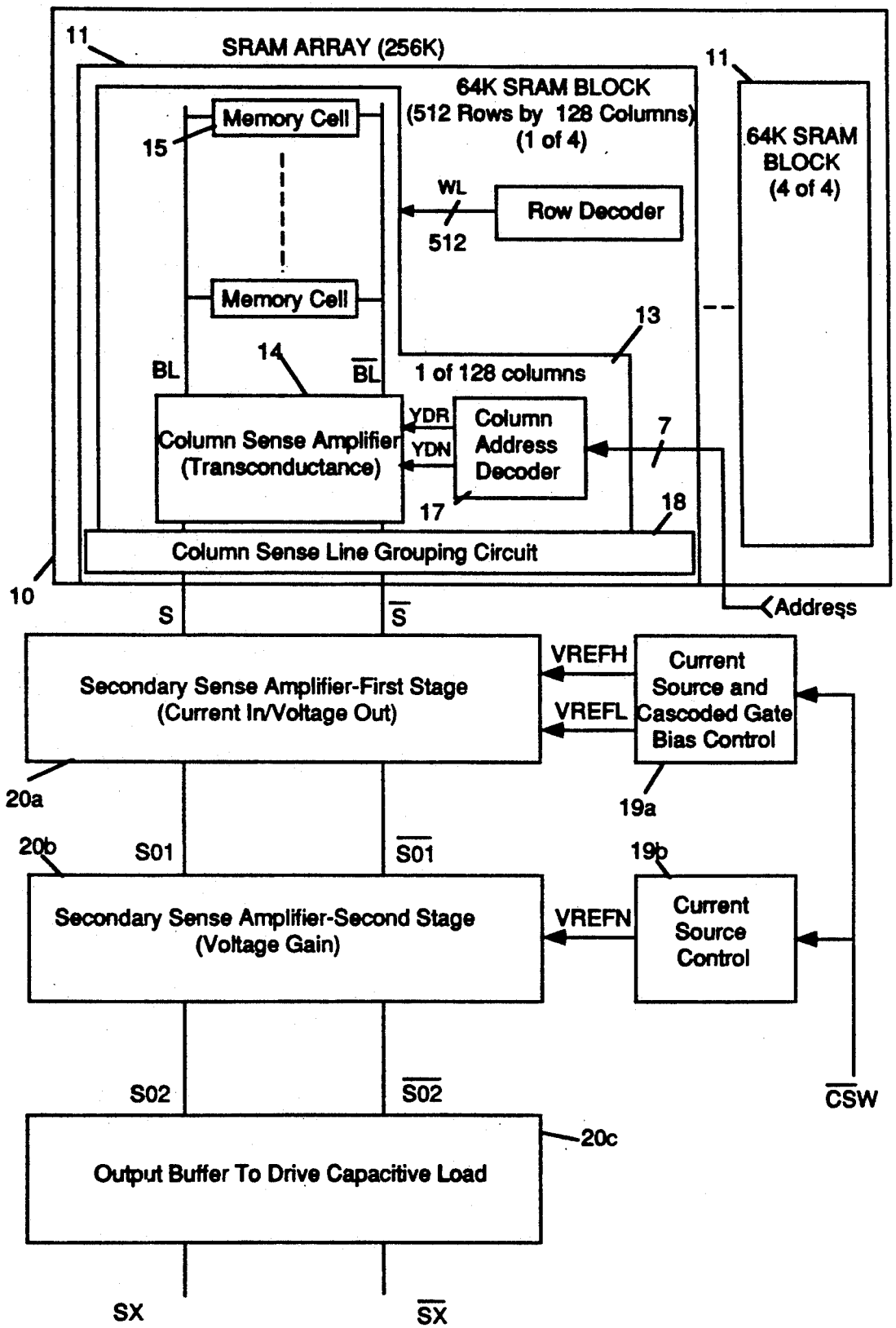
FIG. 1 is a block overview diagram showing the elements of the invented sense amplifier.

Referring to FIG. 1, SRAM 10 is shown as a 256K bit SRAM arranged as four 64K blocks 11, with each block having 512 rows and 128 columns 13. Of course, the specifics of the organization of the SRAM array are set forth by way of example for the purpose of describing the invention, the scope of which is limited only by the claims appended to this description. Each of the 128 columns has two bitlines designated BL and BL# coupled on either side of each of the 512 cells in the column. The content of a memory cell 15 at a row and column intersection determined by outputs from row decoder 16 and column decoder 17 generates a voltage differential signal on column sense lines BL and BL# based upon the content of the selected memory cell 15. Column sense lines BL and BL# are input to column sense amplifier 14 which amplifies the small voltage differential and converts it to a current differential on sense line S and sense compliment line S#. The sense and sense compliment pairs from the column sense amplifier 14 for each of the 128 columns 13 run through the array of column sense amplifier cells at the bottom of the SRAM memory block thereby forming a column sense grouping circuit function 18 which combines the sense line pairs from each of the 128 column sense amplifiers to a single sense line pair S/S#, which pair is the secondary sense amplifier 20a/20b input. The secondary sense amplifier circuit-first stage 20a converts the small signal swing on sense lines S and S# from the current differential to a voltage differential. The voltage differential is further amplified by secondary sense amplifier circuit-second stage 20b and input to output buffer 20c which generates a voltage differential on lines SX and SX# used to drive a capacitive load. The sense amplifier is powered up under the control of a signal CS# W which goes low when the chip is selected during a read cycle.

Figure 2A:
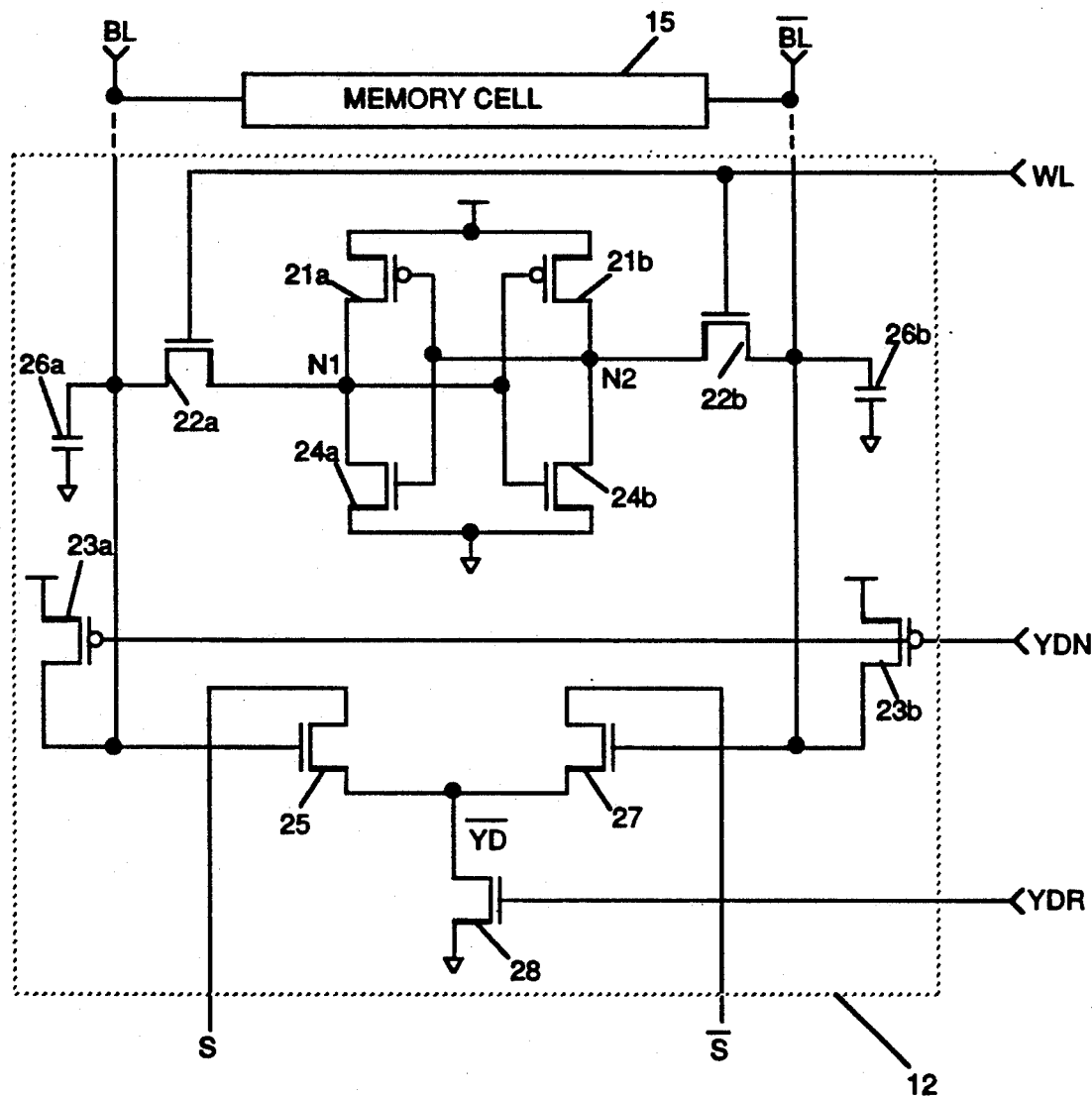
FIG. 2a is a schematic diagram of a local or column sense amplifier used in the present invention for N channel MOS column sensing.
Figure 2B:
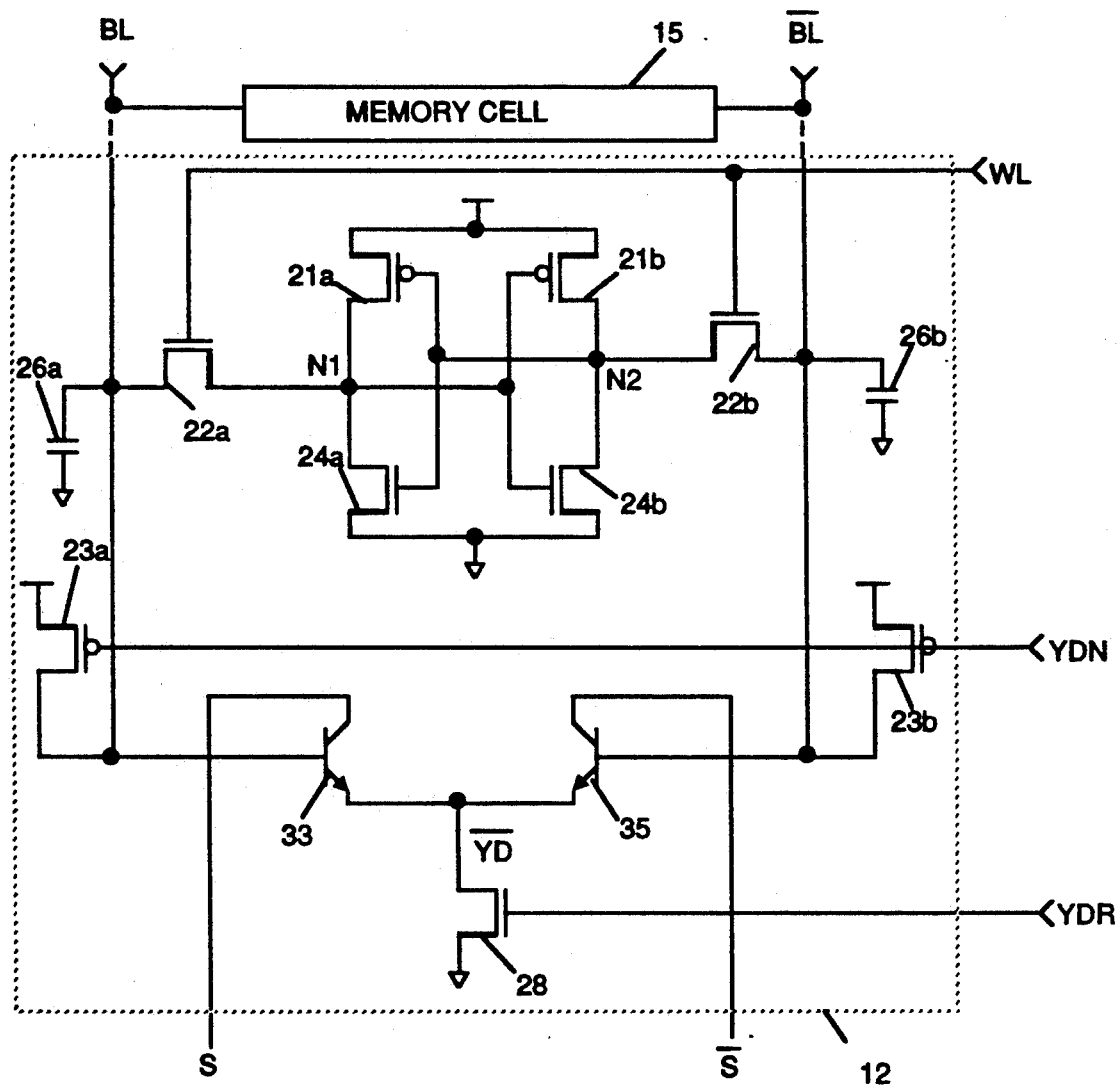
FIG. 2b is a schematic diagram of a local or column sense amplifier used in the present invention for bipolar column sensing.

FIG. 2a shows the signal path for a single NMOS column sense amplifier and FIG. 2b shows the signal path for a single bipolar column sense amplifier.

Bias signals VREFH and VREFL generated by current source and cascoded gate bias control circuit 19a are input to secondary sense amplifier-first stage 20a. Bias signal VREFN generated by current source control circuit 19b is input to secondary sense amplifier-second stage 20b.

Referring to FIGS. 2a and 2b, a selected memory bit or cell 15 within a column 13 of SRAM block 11 draws current from the BL or BL# line depending on whether a 0 or a 1 is stored in the cell. The cell to be read is selected by the wordline select signal WL generated by row decoder 16, and the bitline pullup signal YDN and column sense line pulldown signal YDR generated by column address decoder 17. Specifically, WL, when asserted, causes transistor 22a or transistor 22b to pass current to its corresponding bitline BL or BL#, depending on the type of data (0 or 1) stored in the selected memory cell 15 by the cross-coupled inverter formed by transistors 21a and 24a or transistors 21b and 24b, respectively.

If a 0 is stored in the cell, P channel transistor 21b maintains node N2 at Vcc. Thus, there is no current being drawn from transistor 22b to pulldown bitline BL#. Since node N1 is low for "0" data, the BL line develops a voltage difference relative to the BL# line as the cell read current through transistor 22a discharges the BL line capacitance. P channel transistor 23a acts as a load for the cell read current so the BL line never completely discharges to Vss. Thus, a negative differential voltage is created between the BL and the BL# lines signifying a 0.

If a 1 is stored in the cell, node N1 is high and node N2 is low, thus N channel transistor 24a is off so no current flows through transistor 22a and bitline BL remains at Vcc. The BL# bitline line however develops a voltage difference relative to bitline BL as transistor 24b is on and, therefore, transistor 22 conducts the cell read current to discharge the BL# bitline capacitance. P channel transistor 23b acts as a load for the cell read current so the BL# bitline never completely discharges to Vss. Thus, a positive differential voltage is created between the BL# and the BL bitlines signifying a 1.

Capacitors 26a and 26b coupled between vss and bitlines BL and BL#, respectively, represent the effective capacitive load that is created by the memory cells 15 connected together onto a single BL/BL# bitline pair forming a single column within a 64K SRAM block 11. The signal YDN is coupled to the gates of bitline BL pull-up transistors 23a and 23b in order to turn these transistors "on" during a read and "off" during a write to the memory cell. The signal YDN is enabled (i.e., set to low for a read) when column address decoder 17 determines that a memory cell within the particular column 16 is being addressed for a read by decoding the address on an address bus, which for a 128 column SRM block is a seven bit wide signal.

In the case of N channel MOS column sensing, the BL and BL# bitlines go to the gates of N channel transistors 25 and 27 respectively. These devices function as a source coupled transconductance differential pair made of transistors 25 and 27 whose common sources are connected to the pull down signal YD# and are biased by the current source transistor 28 which is controlled by column select signal YDR generated by column address decoder 17. The signal YDR is enabled when the column address decoder determines that a memory cell within the particular column 16 is being addressed by decoding the address on the address bus. The details for implementing column decoder 17 to generate the YDR and YDN signals as described above should be readily apparent to persons skilled in the field of the invention and, therefore, will not be set forth herein.

In the case of bipolar column sensing, and referring now to FIG. 2b, the BL and BL# bitlines connect to the bases of bipolar devices 33 and 35 whose collectors are connected to the sense lines S and S# and whose common emitters are connected to the pull down signal YD#. The function of these devices is the same as the N channel MOS sense devices 25 and 27 discussed above. However, the bipolar devices have significantly higher transconductance and are preferred when the SRAM can be designed with a BiCMOS process. For a CMOS SRAM, the N channel CMOS column sensing described above is utilized.

Figure 3:
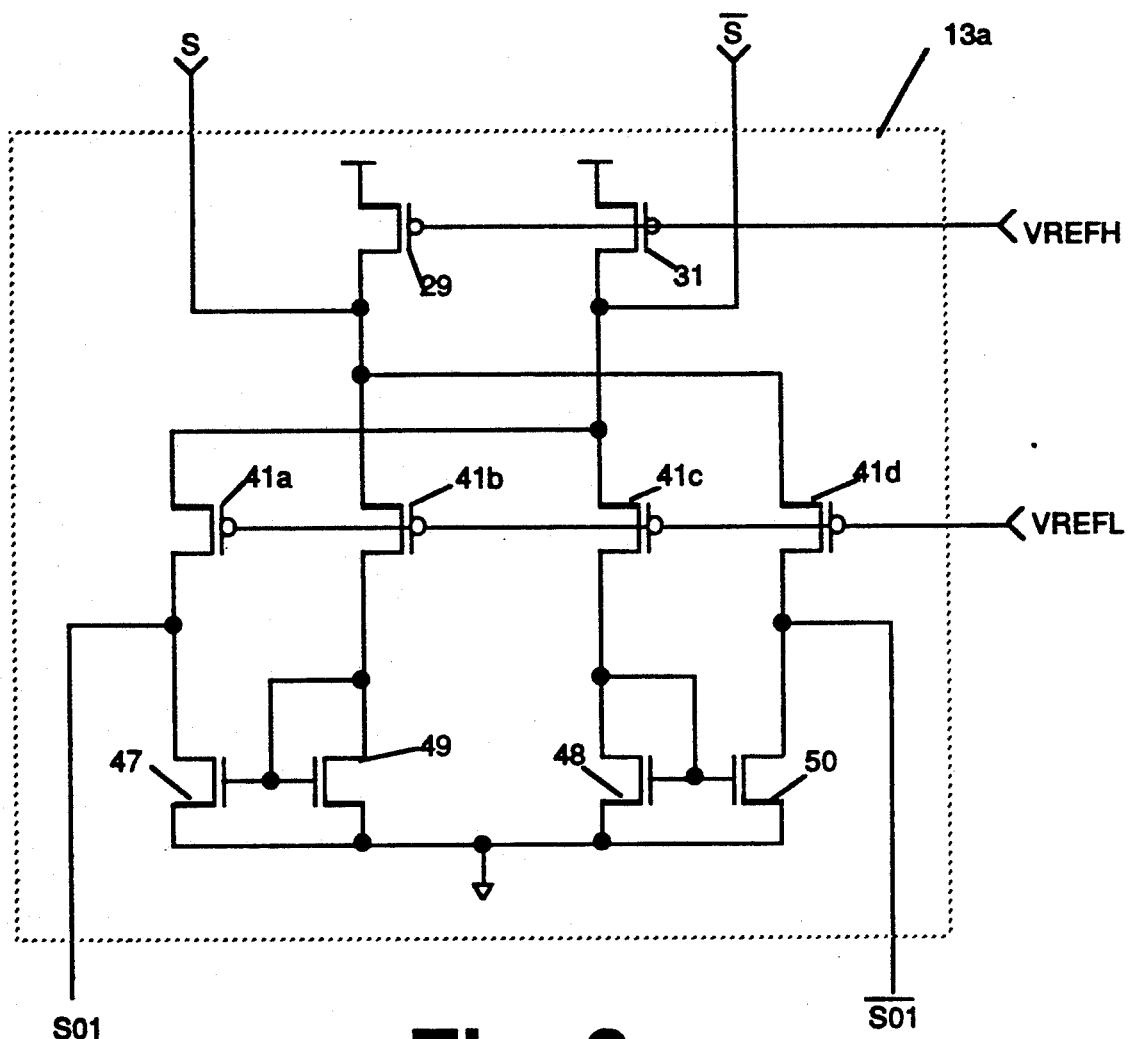
FIG. 3 is a schematic diagram of the first stage of a global or secondary sense amplifier according to the present invention.

Referring next to FIG. 3 which is a circuit diagram of secondary sense amplifier-first stage 20a, the drains of transistors 29 and 31 are connected to the S and S# lines from column sense line grouping circuit 18 to the low input impedance common gate cascode sense amplifier shown in FIG. 3. The small voltage differential which develops on the S and S# lines is a function of the low input impedance provided by the common gate input transistors 41a, 41b, 41c and 41d on the sense amplifier input.

To understand the operation of the sense amplifier, it is best to consider the differential current on the sense lines S and S# as the input signal to the secondary sense amplifier. Referring to FIG. 3, transistors 29 and 31 are biased as current source pull-ups to the sense lines and the common gate differential first stage of the sense amplifier. When the column sense amplifier 14 is powered up, one of the two sense line pulldown transistors 25 or 27 (FIG. 2a for N channel MOS column sensing) or transistors 33 or 35 (FIG. 2b for bipolar column sensing) is on more than the other. In a steady state DC condition, a current I from transistor 29 flows and divides into the sources of transistors 41b and 41d as well as the drain of the sense line pulldown transistor 25 or collector of the sense line pulldown transistor 33 in the column sense amplifier circuit 12. Similarly for the other side, a current I flows from transistor 31 into the sources of transistors 41a and 41c, and the drain of the sense line S# pulldown transistor 27 or collector of the sense line S# pulldown transistor 35 in the column sense amplifier circuit 12. The selected column sense amplifier read circuit 12 is timed to turn on as close as possible to the powerup time of the secondary sense amplifier 20a/20b.

This power up is controlled by bias signals VREFH, VREFL and VREFN coming from current source and cascoded gate bias control circuit 19a and current source control circuit 19b. Bias signal VREFH comes from current source and cascoded gate bias control circuit 19a to bias transistors 29 and 31 as constant current sources. Bias signal VREFL comes from current source and cascoded gate bias control circuit 19b to bias the common gates of the sense amplifier input transistors 41a, 41b, 41c, and 41d as a common gate cascode amplifier. Bias signal VREFN comes from current source control bias circuit 19b to bias the current source transistors 51 and 53 in the second differential stage of the sense amplifier.

Bias voltage VREFH is the p-channel threshold voltage (VTP) minus approximately 1.0 volt below the Vcc. VREFL is VTP minus approximately 1.6 volt below the Vcc. VREFN is the n-channel threshold voltage (VTN) plus approximately 1.0 volt above Vss. The factors involved in determining the precise voltages for VREFH, VREFL and VREFN are as follows. VREFH should be as close to Vcc as possible so that the drain to source saturation voltage of transistors 29 and 31 is as low as possible. VREFL should be as high as possible for maximum output voltage swing on lines SO1 and SO1#, but not so high that the sources of transistors 41a, 41b, 41c and 41d take transistors 29 and 31 out of saturation (i.e., current source operation). The current source and cascoded gate bias control circuit 19a used to generate the VREFH and VREFL signals and current source control circuit 19b used to generate the VREFN signal as described above utilize MOS devices having their gates connected to their drains (i.e., a diode configuration) connected as a current mirror like circuit with another MOS device, the implementation details for which should be readily apparent to persons skilled in the field of the invention and, therefore, will not be set forth herein.

In the nominal zero differential current input state, devices 29 and 31 divide current approximately as follows: 50% of the device 29 current to the drain of the sense line pulldown transistor 25 or collector of the sense line pulldown transistor 33 and 25% to each of the devices 41b and 41d; and 50% of the device 31 current to the drain of the sense line pulldown transistor 27 or collector of the sense line pulldown transistor 35 and 25% to each of the devices 41a and 41c. When the differential current signal d(i) develops (for data "0") between the sense line pulldown devices 25 and 27, i.e. device 25 current −d(i/2) and device 27 current +d(i/2), then the current in devices 41b and 41d increases by d(i/4) and the current in devices 41a and 41c decreases by d(i/4).

Devices 47 and 49, and devices 48 and 50 are current mirrors which convert the differential currents flowing along S and S# into single ended voltage outputs SO1 and SO1#. By the cross-connection of the sources of device 41b with device 41d to line S and device 41a with device 41c to line S#, the two differential amplifiers formed by devices 41a, 41b, 47 and 49 and devices 41c, 41d, 48 and 50 form a double balanced differential amplifier stage with differential voltage output SO1 and SO1#.

Figure 4:
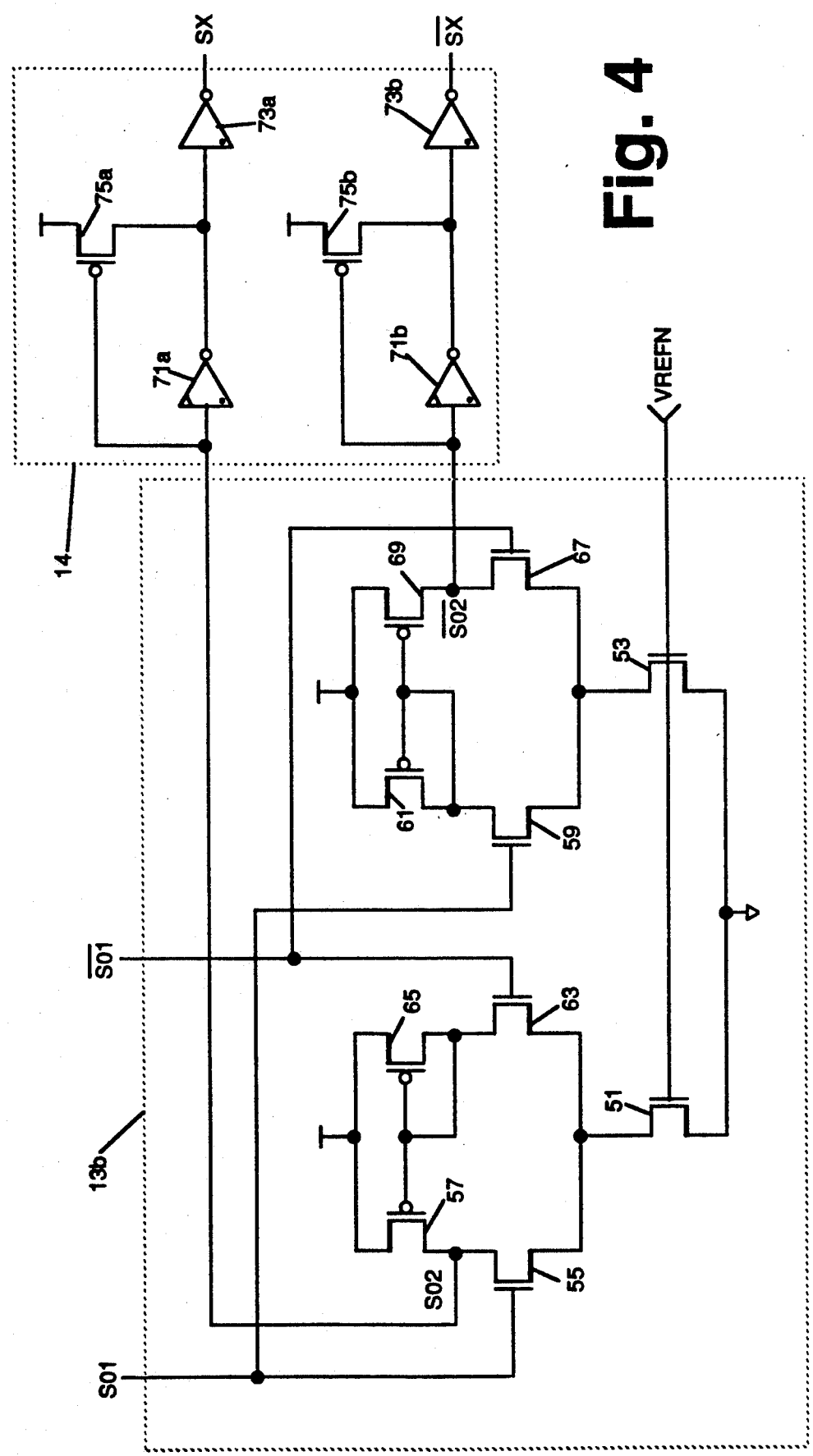
FIG. 4 is a schematic diagram of the second stage of a global or secondary sense amplifier and output buffer according to the present invention.

Outputs SO1 and SO1# are inputs to the second differential amplifying stage 20b of the secondary sense amplifier which is shown in FIG. 4. In this stage, there are two cross-coupled differential amplifiers formed by devices 55, 63, 57, 65 and devices 59, 67, 61, and 69.

Devices 51 and 53 provide the tail current bias to these source coupled amplifiers. The differential outputs SO2 and SO2# go to two stages of buffering, an inverter 71a for SO2 and 71b for SO2# followed by a CMOS inverter 73a for SO2 or 73b for SO2#, before the SX and SX# signals are routed to the output buffer. Transistors 75a and 75b are used to provide for full supply swing with BiCMOS inverters.

I claim:

1. A current sensing amplifier for a static random access memory array including a plurality of columns of memory cells, each said column having a pair of bit sense lines coupled to each memory cell within said column, said current sensing amplifier comprising:
    a) column sense amplifier means corresponding to each of said plurality of columns for sensing a voltage differential on said bit sense lines of said corresponding column, amplifying said voltage differential and converting said amplified voltage differential to a current differential on a corresponding first and second sense line pair;
    b) first and second sense line grouping means coupled to each of said corresponding first and second sense line pairs for grouping said corresponding first and second sense line pairs into a single corresponding first sense line and second sense line;
    c) first stage sense amplifier means coupled to each of said column sense amplifier means for converting said current differential to a second voltage differential;
    d) second stage sense amplifier means coupled to said first stage sense amplifier means for amplifying said second voltage differential for input to an output buffer adapted to drive a capacitive load.

2. The current sensing amplifier defined by claim 1 wherein said column sense amplifier means comprises:
    a) a first transistor coupled to a first one of said bit sense line pairs and a second transistor coupled to a second one of said bit sense line pairs, said first and second transistors having gates coupled to a wordline which is asserted one one of the memory cells within said corresponding column is selected for a read operation, one of said first and second transistors passing a current to its corresponding bit sense line depending on whether a 0 or a 1 is stored in the selected memory cell;
    b) a first cross coupled inverter coupled to said first transistor and a second cross coupled inverter coupled to said second transistor, said first and second cross coupled inverters also coupled between a predetermined source voltage and a ground;
    c) a first capacitor coupled to said first transistor and between said ground and said said first bit sense line and a second capacitor coupled to said second transistor and between said ground and said said second bit sense line;
    d) a first bitline pull-up transistor coupled to said first bitline and a second bitline pull-up transistor coupled to said second bitline, said first and second bitline pull-up transistors having gates coupled to s signal which is enabled when one of said memory cells within said corresponding column is selected for a read operation;
    e) a pair of transistors coupled as a transconductance differential pair, a first one of said transistors forming said transconductance differential pair coupled to said first bitline and a second one of said transistors forming said transconductance differential pair coupled to said second bitline, said transconductance differential pair biased by a current source transistor having its gate coupled to a signal enabled when one of said memory cells within said corresponding column is addressed.

3. The current sensing amplifier defined by claim 2 wherein said transconductance differential pair is formed by a source coupled N channel transistor pair whose gates are coupled to said first and second bitlines respectively.

4. The current sensing amplifier defined by claim 2 wherein said transconductance differential pair is formed by an emitter coupled bipolar transistor pair whose bases are coupled to said first and second bitlines respectively.

5. The current sensing amplifier defined by claim 1 wherein said first stage sense amplifier means comprises:
   a) a first transistor having its drain coupled to said first sense line and a second transistor having its drain coupled to said second sense line, said first and second transistors biased as constant current sources;
   b) first and second common gate cascode amplifiers respectively coupled to said first and second transistors;
   c) first and second current mirrors respectively coupled to said first and second gate common gate cascode amplifiers, said first and second common gate cascode amplifiers and said first and second current mirrors forming a double balanced differential amplifier stage.

6. The current sensing amplifier defined by claim 1 wherein said second stage sense amplifier means comprises:
   a) first and second cross coupled differential amplifiers coupled to said first stage amplifier means;
   b) a two stage buffer coupled to said first and second cross coupled differential amplifiers, said two stage buffer including a first inverter followed by a second inverter.

7. The current sensing amplifier defined by claim 5 wherein said first and second common gate cascode amplifiers comprise two pairs of transistors, the transistors in both pairs having a common gate coupling, one transistor of each transistor pair having its source coupled to a respective one of said first and second sense lines.

8. The current sensing amplifier defined by claim 5 wherein said first and second current mirrors comprise two pairs of common gate coupled transistors, the drains of the transistors in one of said pairs coupled to said first common gate cascode amplifier and the drains of the transistors in a second one of said pairs coupled to said second common gate cascode amplifier.

9. The current sensing amplifier defined by claim 6 wherein said first and second cross coupled differential amplifiers each comprise:
   a) two pairs of transistors, each pair having a common drain, wherein said two transistor pairs for said first and second cross coupled differential amplifiers are coupled to each other by common sources; and
   b) a tail bias transistor whose drain is coupled to one pair of said common sources, whose source is coupled to ground and whose gate is coupled to a tail current bias signal.

* * * * *